United States Patent
Ferrer et al.

(10) Patent No.: US 9,293,365 B2
(45) Date of Patent: Mar. 22, 2016

(54) HARDMASK REMOVAL FOR COPPER INTERCONNECTS WITH TUNGSTEN CONTACTS BY CHEMICAL MECHANICAL POLISHING

(71) Applicant: International Business Machines Corporation, Armonk, NY (US)

(72) Inventors: Domingo A. Ferrer, Fishkill, NY (US); Jim Shih-Chun Liang, Poughkeepsie, NY (US); Joyeeta Nag, Wappingers Falls, NY (US); Wei-tsu Tseng, Hopewell Junction, NY (US); George S. Tulevski, Croton-on-Hudson, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 203 days.

(21) Appl. No.: 14/226,891

(22) Filed: Mar. 27, 2014

(65) Prior Publication Data

US 2015/0279733 A1 Oct. 1, 2015

(51) Int. Cl.
*H01L 21/4763* (2006.01)
*H01L 23/48* (2006.01)
(Continued)

(52) U.S. Cl.
CPC .... *H01L 21/76877* (2013.01); *H01L 21/02063* (2013.01); *H01L 21/31058* (2013.01); *H01L 21/31144* (2013.01); *H01L 21/32133* (2013.01); *H01L 21/7684* (2013.01);
(Continued)

(58) Field of Classification Search
CPC .............. H01L 21/76877; H01L 21/7688; H01L 21/02063; H01L 21/31058; H01L 21/31144; H01L 21/32133; H01L 21/76805; H01L 23/53223; H01L 23/53328; H01L 23/53266; H01L 23/53276; H01L 23/5329
USPC ......... 438/629, 631, 637, 639, 667, 670, 671, 438/672, 675, 687; 257/750, 752, 768, 774
See application file for complete search history.

(56) References Cited

U.S. PATENT DOCUMENTS

| 6,174,800 B1 | 1/2001 | Jang |
| 7,560,375 B2 * | 7/2009 | Filippi .............. H01L 21/76807 438/618 |

(Continued)

OTHER PUBLICATIONS

Loquet et al., "56 nm pitch Cu dual-damascene interconnects with self-aligned via using negative-tone development Lithography-Etch-Lithography-Etch patterning scheme", Microelectronic Engineering 107 (2013), p. 138-144.

(Continued)

*Primary Examiner* — Kevin M Picardat
(74) *Attorney, Agent, or Firm* — Catherine Ivers; Andrew M. Calderon; Roberts Mlotkowski Safran & Cole, P.C.

(57) ABSTRACT

The present invention relates generally to forming interconnects over contacts and more particularly, to a method and structure for filling interconnect trenches with a sacrificial filler material before removal of a hard mask layer to protect the liners of the contacts from damage during the removal process. A method is disclosed that may include: filling an opening in a dielectric layer above a contact and a contact liner with a sacrificial filler material, such that the contact liner is completely covered by the sacrificial filler material; removing a hard mask layer used to pattern and form the opening; and removing the sacrificial filler material from the opening selective to the dielectric layer, the contact liner, and the contact to form an interconnect trench.

20 Claims, 6 Drawing Sheets

(51) Int. Cl.
*H01L 21/768* (2006.01)
*H01L 21/02* (2006.01)
*H01L 21/3105* (2006.01)
*H01L 21/311* (2006.01)
*H01L 21/3213* (2006.01)
*H01L 23/532* (2006.01)

(52) U.S. Cl.
CPC ...... *H01L 21/76805* (2013.01); *H01L 23/5329* (2013.01); *H01L 23/53223* (2013.01); *H01L 23/53238* (2013.01); *H01L 23/53266* (2013.01); *H01L 23/53276* (2013.01)

(56) References Cited

U.S. PATENT DOCUMENTS

| | | | |
|---|---|---|---|
| 8,772,933 B2 * | 7/2014 | Ou | H01L 23/5226 257/632 |
| 2007/0117342 A1 | 5/2007 | Chen et al. | |
| 2009/0239369 A1 * | 9/2009 | Kim | H01L 21/31144 438/598 |
| 2010/0190347 A1 | 7/2010 | RamachandraRao et al. | |
| 2012/0315755 A1 | 12/2012 | Bartsch et al. | |
| 2013/0045908 A1 | 2/2013 | Cui | |
| 2013/0171829 A1 | 7/2013 | Fitzsimmons et al. | |
| 2014/0252620 A1 * | 9/2014 | Huang | H01L 23/53238 257/751 |
| 2015/0179578 A1 * | 6/2015 | Jezewski | H01L 23/5329 257/768 |

OTHER PUBLICATIONS

Disclosed Anonymously, "Use of a sacrificial Ruthenium hard mask for Cu Back End of Line (BEOL) interconnect structures", IP.com, Mar. 7, 2011, p. 1, IPCOM000204628D.

* cited by examiner

HARDMASK REMOVAL FOR COPPER INTERCONNECTS WITH TUNGSTEN CONTACTS BY CHEMICAL MECHANICAL POLISHING

BACKGROUND

The present invention relates generally to forming interconnects over middle of the line contacts and more particularly, to a method and structure for filling interconnect trenches with a sacrificial filler material before removal of a hard mask layer to protect the liners of the middle of the line contacts from damage during the removal process.

Conventional methods of forming interconnects in a semiconductor device may involve depositing an inter-level dielectric over a middle of the line layer containing contacts. The contacts may be composed of a conductive material, and may have liners formed on their sidewalls in order to prevent diffusion of the conductive material into the middle of the line layer. Typically, a hard mask layer may formed over the interconnect dielectric layer and patterned so that interconnect trenches, some of which may extend to the contacts, may be formed in the interconnect dielectric layer. After the interconnect trenches have been formed, the hard mask layer may be removed in order to form the interconnects and to continue fabrication.

SUMMARY

According to an embodiment, a method is disclosed. The method may include: forming a dielectric layer on a contact, the contact having a vertical sidewall and a contact liner formed thereon; forming a hard mask layer on the dielectric layer; forming an opening in the hard mask layer and the dielectric layer, such that the contact and the contact liner are exposed; filling the opening with a sacrificial filler material, such that the contact and the contact liner are substantially covered by the sacrificial filler material; removing the hard mask layer and a portion of the sacrificial filler material, such that an upper surface of the sacrificial filler material in the opening is substantially flush with an upper surface of the dielectric layer; and removing the sacrificial filler material from the opening selective to the dielectric layer, the contact liner, and the contact to form an interconnect trench.

According to another embodiment, a method of method of protecting a contact liner from damage during a formation of an interconnect structure is disclosed. The method may include: patterning a dielectric layer using a hard mask; forming an opening in the dielectric layer to expose the contact liner, wherein the contact liner is formed on a sidewall of a contact; covering the contact liner with a sacrificial filler material; and removing the hard mask layer using a planarization process.

According to another embodiment, a interconnect structure is disclosed. The structure may include: a contact in a first layer, the contact having an upper surface that is substantially flush with an upper surface of the first layer; a contact liner on a sidewall of the contact, the contact liner having an upper surface that is substantially flush with the upper surface of the contact; a keyhole defect in the upper surface of the contact; a filler material in the keyhole defect; a second layer on the first layer; and an interconnect in the second layer, the interconnect extending from an upper surface of the second layer to the upper surface of the contact, such that the interconnect is in electrical contact with the contact.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
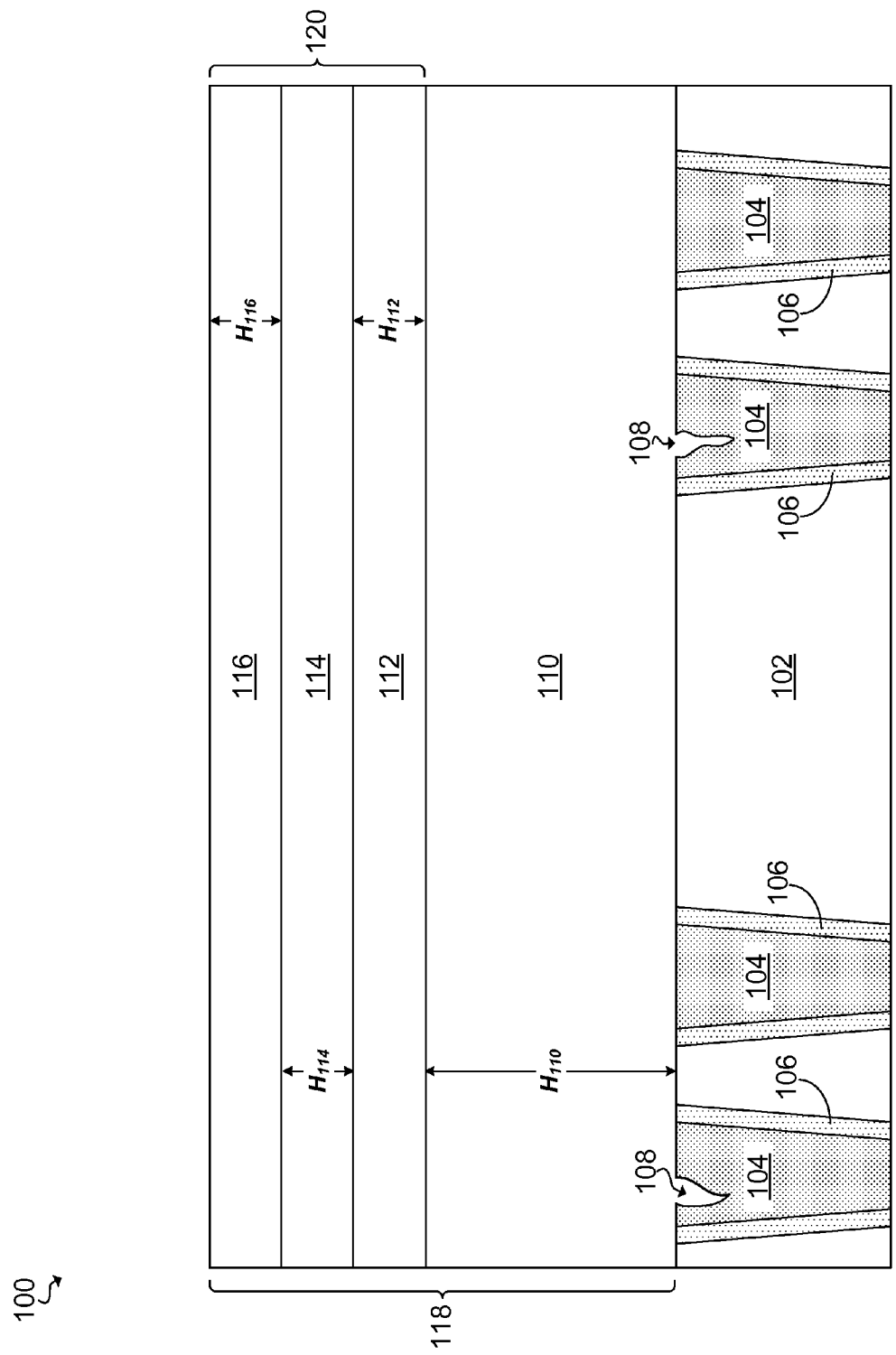
FIG. 1 is a cross section view illustrating forming an M1 layer over a MOL layer, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Conventional techniques used form back end of the line (BEOL) interconnects over middle of the line (MOL) contacts may cause damage to the MOL contact liners, especially during the removal of a hard mask layer used to pattern and form interconnect trenches. The damage may be particularly prevalent when there is misalignment of an interconnect trench over a MOL contact and MOL contact, which may expose the MOL contact liner, as illustrated in the left hand side of the figures bellow. The exposed MOL contact liner may be damaged during the removal of a hardmask layer used to pattern and form the interconnect trench, especially in embodiments in which the hardmask and the MOL contact liners are both made of similar materials (i.e., a titanium nitride hardmask and a titanium nitride MOL contact liner). The damage done during hardmask removal may cause air gaps (i.e., "hollow" metal defects) in the MOL contact liners. These air gaps may allow for the conductive material of the contacts to diffuse into the MOL layer, which may negatively affect electrical conductivity and device reliability. Dielectric caps may be formed over the MOL contacts in order to protect them, but this technique may introduce additional processing steps in order to form and remove the caps before the formation of the interconnects.

The present invention relates generally to forming interconnects over MOL contacts and more particularly, to a method and structure for filling interconnect trenches with a sacrificial filler material before removal of a hard mask layer to protect the liners of the MOL contacts from damage during the removal process. One way to protect the MOL contact liners, without the additional processing steps associated with forming and removing dielectric caps, may include depositing a sacrificial filler material in the interconnect trenches, covering the MOL contacts and the MOL contact liners, before removal of the hard mask layer. The sacrificial filler material not only protect the MOL contact liners, it may give added rigidity to the structure during removal of the hard mask, and may be easy to remove before formation of the interconnects. Embodiments by which to form interconnects using a sacrificial filler material to protect the MOL contact liners are described below in detail with reference to FIGS. 1-6.

Referring now to FIG. 1, a cross section view of a structure 100 is shown. FIG. 1 illustrates forming an M1 layer 118 over a MOL layer 102. The MOL layer 102 may be formed on a semiconductor substrate (not shown) and may be composed one or more layers of dielectric and/or hard mask materials, such as, for example, tetraethyl orthosilicate (TEOS) and silicon nitride (SiN). The MOL layer 102 may be formed by any conventional deposition technique known in the art, such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD).

The MOL layer 102 may include one or more contacts 104 (hereinafter "contacts") and one or more contact liners 106 (hereinafter "contact liners") formed thereon. The contacts 104 and contact liners 106 may be formed by first patterning and etching contact trenches (not shown) in the MOL layer 102 using any conventional patterning and etching technique known in the art, such as, for example, reactive ion etching (RIE). The contact liners 106 may then be formed in the contact trenches (not shown) by any conventional deposition process known in the art, such as, for example, ALD, CVD, PVD, MBD, PLD, or LSMCD. In an embodiment, the contact liner 106 may be formed in the contact trenches (not shown) by depositing a liner material using a conformal deposition process and then removing the liner material from horizontal surfaces using an anisotropic etching process. The contact liner 106 may remain on vertical sidewalls of the contact trenches (not shown).

The contacts 104 may then be formed on the contact liners 106 by any conventional deposition technique known in the art, such as for example, ALD, CVD, PVD, MBD, PLD, or LSMCD. The contacts 104 may be composed of a conductive material, such as, for example, a conductive metal such as tungsten (W). The contact liners 106 may be composed of a nitride, such as for example, titanium nitride (TiN) and may act as a barrier to prevent the conductive material of the contacts 104 from diffusing into the MOL layer 102. In an embodiment, one or more of the contacts 104 may include a keyhole defect 108 that is a result of an incomplete deposition of the conductive material. This keyhole defect 108 may be particularly prevalent (e.g., resulting in contacts 104 that are half-filled) in embodiments in which the contacts 104 are composed of W. In an embodiment, the keyhole defect 108 may have a width ranging from approximately 0.5 nm to approximately 10 nm and may extend into the contacts 104 to a depth ranging from approximately 5 nm to approximately 50 nm.

The M1 layer 118 may composed of multiple individual layers. In an embodiment, the M1 layer 118 may include a dielectric layer 110 on the MOL layer 102 and in the keyhole defects 108 and a hard mask layer 120. The hard mask layer 120 may be composed of multiple layers. In an embodiment, the hard mask layer 120 may be composed of a first layer 112 on the dielectric layer 110, a second layer 114 on the first layer 112, and a third layer 116 on the second layer 114. The dielectric layer 110 and the hard mask layer 120 may each be formed by any conventional deposition technique known in the art, such as for example, ALD, CVD, PVD, MBD, PLD, or LSMCD. The dielectric layer 110 may be composed of a low-k dielectric material, such as, for example octamethylcyclotetrasiloxane (OMCTS), fluorosilicate glass (FSG), SiLK™ sold by Dow Chemicals, and Black Diamond™ sold by Applied Materials, and may have a height $H_{110}$ ranging from approximately 100 nm to approximately 130 nm. The first layer 112 may be composed of a low-k hard mask material such as, for example, carbon rich OMCTS, and may have a height $H_{112}$ ranging from approximately 1 nm to approximately 10 nm. The second layer 114 may be composed of a TEOS hardmask and may have a height $H_{114}$ ranging from approximately 5 nm to approximately 25 nm. The third layer 116 may be composed of hardmask having a composition that is similar to the contact liner 106, such as, for example, TiN, and may have a height $H_{116}$ ranging from approximately 15 nm to approximately 35 nm. In an embodiment, the hard mask layer 120 and the contact liner 106 may be composed of a common metal.

Figure 2:
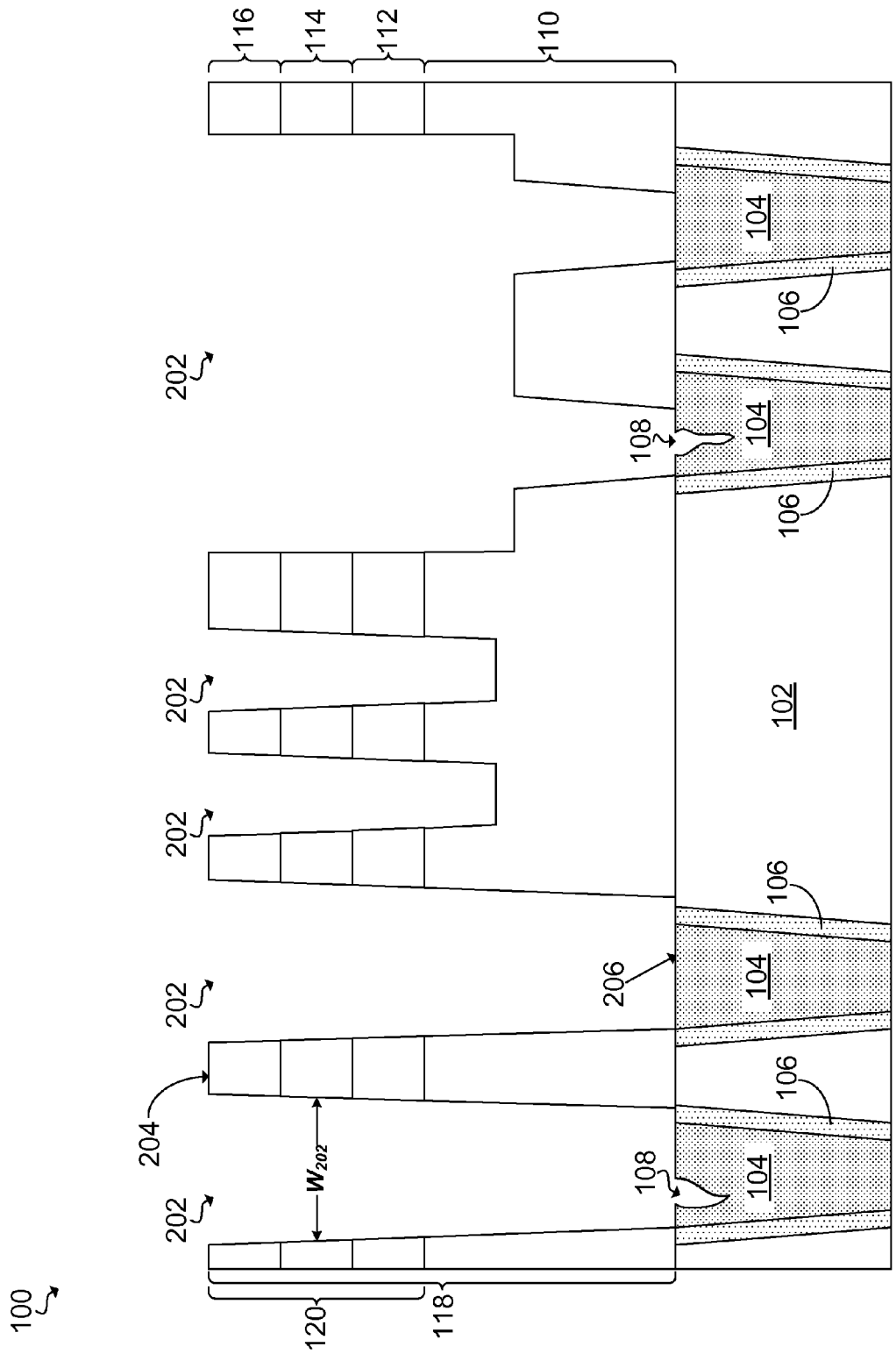
FIG. 2 is a cross section view illustrating forming openings in the M1 layer, according to an embodiment of the present invention.

Referring now to FIG. 2, a cross section view illustrating forming openings 202 in the M1 layer 118 is shown. The openings 202 may be formed by removing portions of the M1 layer 118 using any conventional patterning and etching technique, such as for example, a dual damascene technique, suitable for removing portions of the third layer 116, the second layer 114, the first layer 112, and the dielectric layer 110. In an embodiment, the dual damascene etching technique may include two steps; a first step, in which a portion of the third layer 116 is removed, and a second step in which a portion of the second layer 114, a portion of the first layer 112, and a portion of the dielectric layer 110 is removed. The openings 202 may extend from an upper surface 204 of the M1 layer to an upper surface 206 of the contacts 104. The openings 202 may have a width $W_{202}$ ranging from approximately 20 nm to approximately 45 nm. The openings 202 may expose both the contacts 104 and the contact liners 106. It should be noted that the portions of the dielectric layer 110 present in the keyhole defects 108 may also be removed during the formation of the openings 202.

Figure 3:
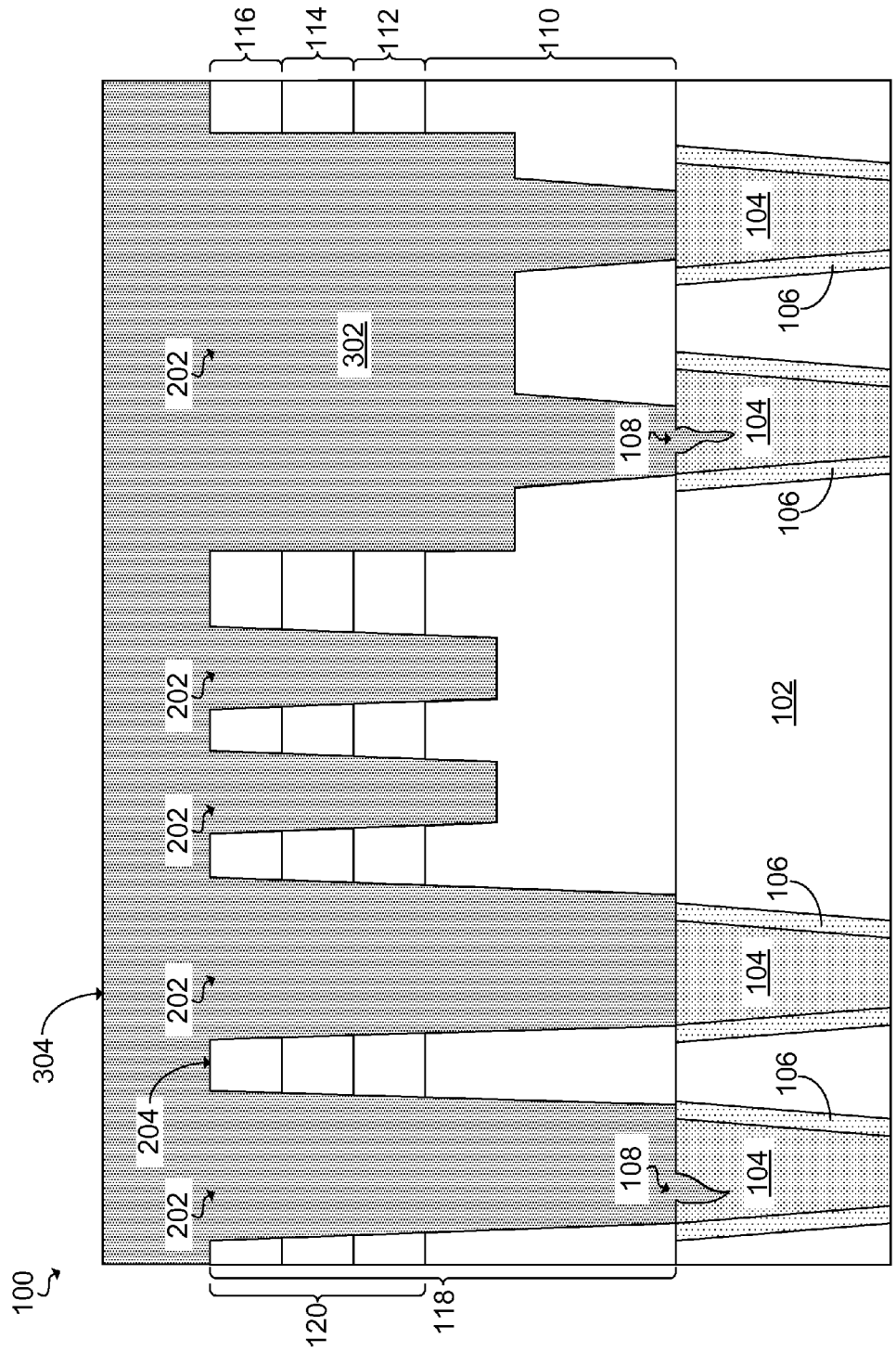
FIG. 3 is a cross section view illustrating depositing a sacrificial filler material in the openings, according to an embodiment of the present invention.

Referring now to FIG. 3, a cross section view illustrating depositing a sacrificial filler material 302 in the openings 202 is shown. The sacrificial filler material 302 may be formed by any conventional deposition technique known in the art, such as for example, ALD, CVD, PVD, MBD, PLD, LSMCD, or a spin on deposition. In an embodiment, the sacrificial filler material 302 may be formed in the openings 202 so that an upper surface 304 of the sacrificial filler material 302 is present above the upper surface 204 of the M1 layer 118. In another embodiment, the upper surface 304 of the sacrificial filler material 302 may be present below the upper surface 204 of the M1 layer 118. In an embodiment, the sacrificial filler material 302 may substantially fill the keyhole defects 108 in one or more of the contacts 104.

In one embodiment, the sacrificial filler material 302 may be composed of an organic material, such as, for example, an organic resist, an organic dielectric layer (ODL), or a combination thereof. Examples of ODLs that can be employed in the invention include, but are not limited to: diamond-like carbon (DLC), fluorinated DLC, polyimides, fluorinated polyimides, parylene-N, parylene-F, benzocyclobutanes, poly(arylene ethers), polytetrafluoroethylene (PTFE) derivatives marketed by Du Pont de Nemours, Inc. under the registered trademark Teflon AF, poly(naphthalenes), poly(norbornenes), foams of polyimides, organic xerogels, porous PTFE and other nano-, micro- or macro-porous organic materials. After the organic material is deposited, it may be cured at an elevated temperature in order to cause the molecules of the organic material to crosslink, enabling the sacrificial filler material 302 to harden.

In another embodiment, the sacrificial filler material 302 may be composed of bundles of carbon nanotubes. Carbon nanotubes are pure carbon molecular structures in which a graphite-like structural layer of covalently bonded carbon atoms is wrapped around into a cylindrical shape. Such a structure has a diameter in the nanometer range, and is potentially orders of magnitude longer in the axial dimension. The carbon nanotubes may be formed using any conventional technique known in the art, such as for, example, nanotube catalyst growth. The carbon nanotubes may then be deposited in the openings 202 by any conventional deposition technique, such as, for example, spray coating, ultrasonic spray coating, or spin-on coating. In the present embodiment, the carbon nanotubes may have a length that is smaller than a minimum width of the openings 202.

The carbon nanotubes may be particular suited for their use as the sacrificial filler material 302 because of their electrical properties. Some carbon nanotubes may have extremely high electrical conductivity up to a current limit, which may be significantly higher than that of ordinary metals. Additionally, the current capacity of carbon nanotubes may be higher than some metals used to form typical interconnects in devices. Accordingly, filling the keyhole defects 108 with carbon nanotubes may improve device performance and reliability by reducing insulating air gaps and providing a solid conductive path for electric current.

In another embodiment, the sacrificial filler material 302 may be composed of nanoparticles. The nanoparticles may include graphite powder, buckminsterfullerene ($C_{60}$), metal nanoparticles, or combinations thereof. In an embodiment, an individual nanoparticle may have a diameter ranging from approximately 1 nm to approximately 10 nm. The nanoparticles may be coated with surfactants to facilitate packing and hardening. The nanoparticles may be deposited by any conventional deposition technique, such as, for example, spray coating and spin-on coating. Because the physical properties of the nanoparticles (e.g., diameter, shape, static attraction to one another) make them pack together very densely into the openings 202 and into the keyhole defects 108, they may be particularly suited for use as the sacrificial filler material 302.

Figure 4:
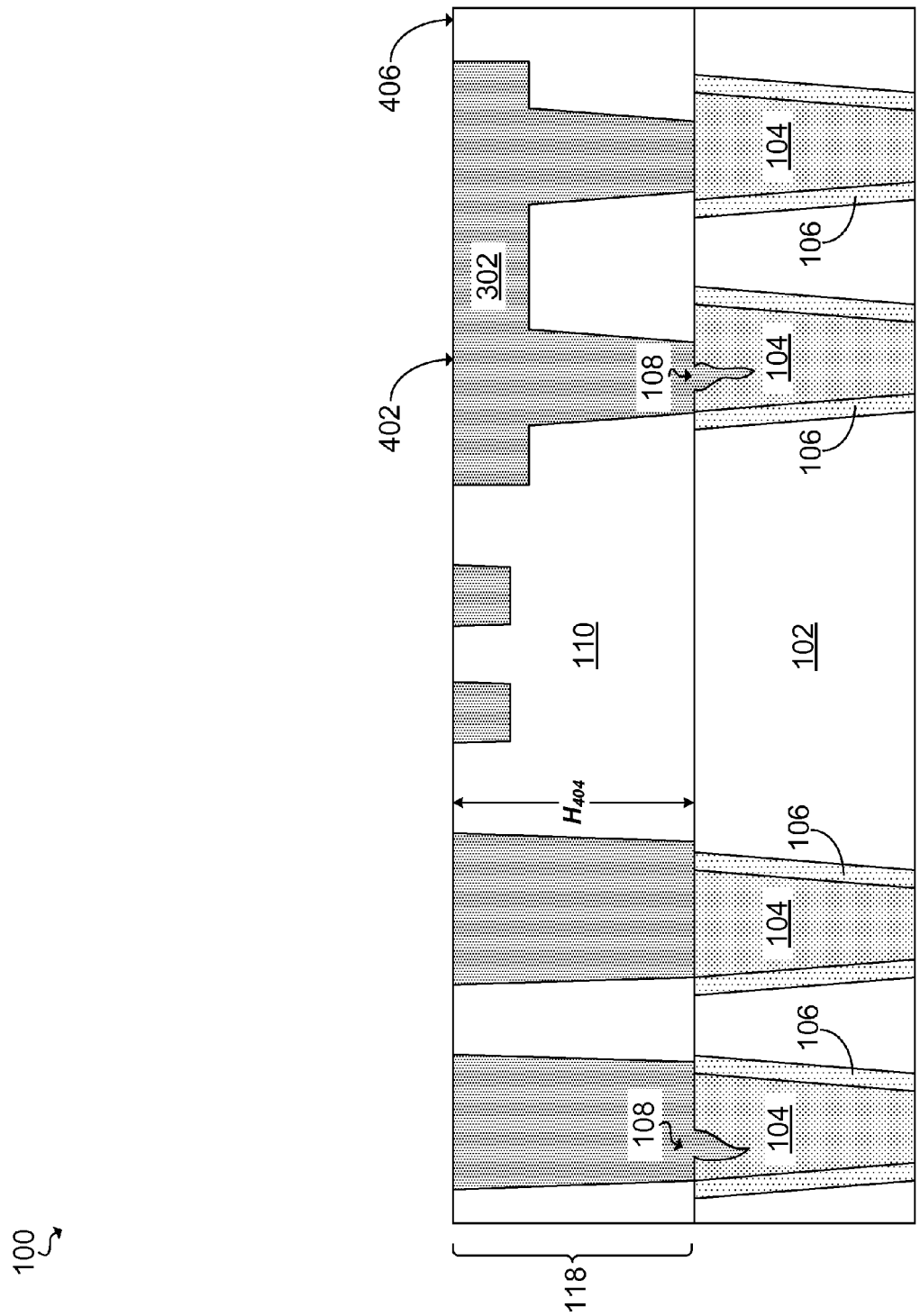
FIG. 4 is a cross section view illustrating removing a portion of the M1 layer and a portion of the sacrificial filler material, according to an embodiment of the present invention.

Referring now to FIG. 4, a cross section view illustrating removing a portion of the M1 layer 118 and a portion of the sacrificial filler material 302 is shown. In an embodiment, the hard mask layer 120 (FIG. 3) and a portion of the sacrificial filler material 302 may be removed using a planarization technique, such as for, example chemical mechanical planarization (CMP). The sacrificial filler material 302 may protect the contact liners 106 from damage during the removal of the hard mask layer 120 (FIG. 3).

It should be noted that the sacrificial filler material 302 may provide additional rigidity to the M1 layer 118 during the planarization process, thereby reducing bowing and any shadowing that may inhibit succeeding metallization steps. Typically, the openings 202 may be left unfilled during planarization in conventional interconnect fabrication techniques. The unfilled openings 202 may affect the structural integrity of the M1 layer 118 and cause the device to bend or bow during planarization. Filling the openings with the sacrificial filler material 302 may restore rigidity to the M1 layer 118, thereby reducing the amount of bending or bowing during planarization. Accordingly, this may result in interconnect trenches having sidewalls that are more straight and vertical (i.e., higher aspect ratio) than the sidewalls of interconnect trenches formed using conventional techniques. This may allow for a more complete fill of the interconnect trenches with conductive material during the formation of interconnects.

In an embodiment, a portion of the dielectric layer 110 layer may be removed during planarization, such that the dielectric layer 110 has a reduced height $H_{404}$ ranging from approximately 85 nm to approximately 115 nm. In an embodiment, an upper surface 402 of the sacrificial filler material 302 may be substantially flush with an upper surface 406 of the dielectric layer 110.

Figure 5:
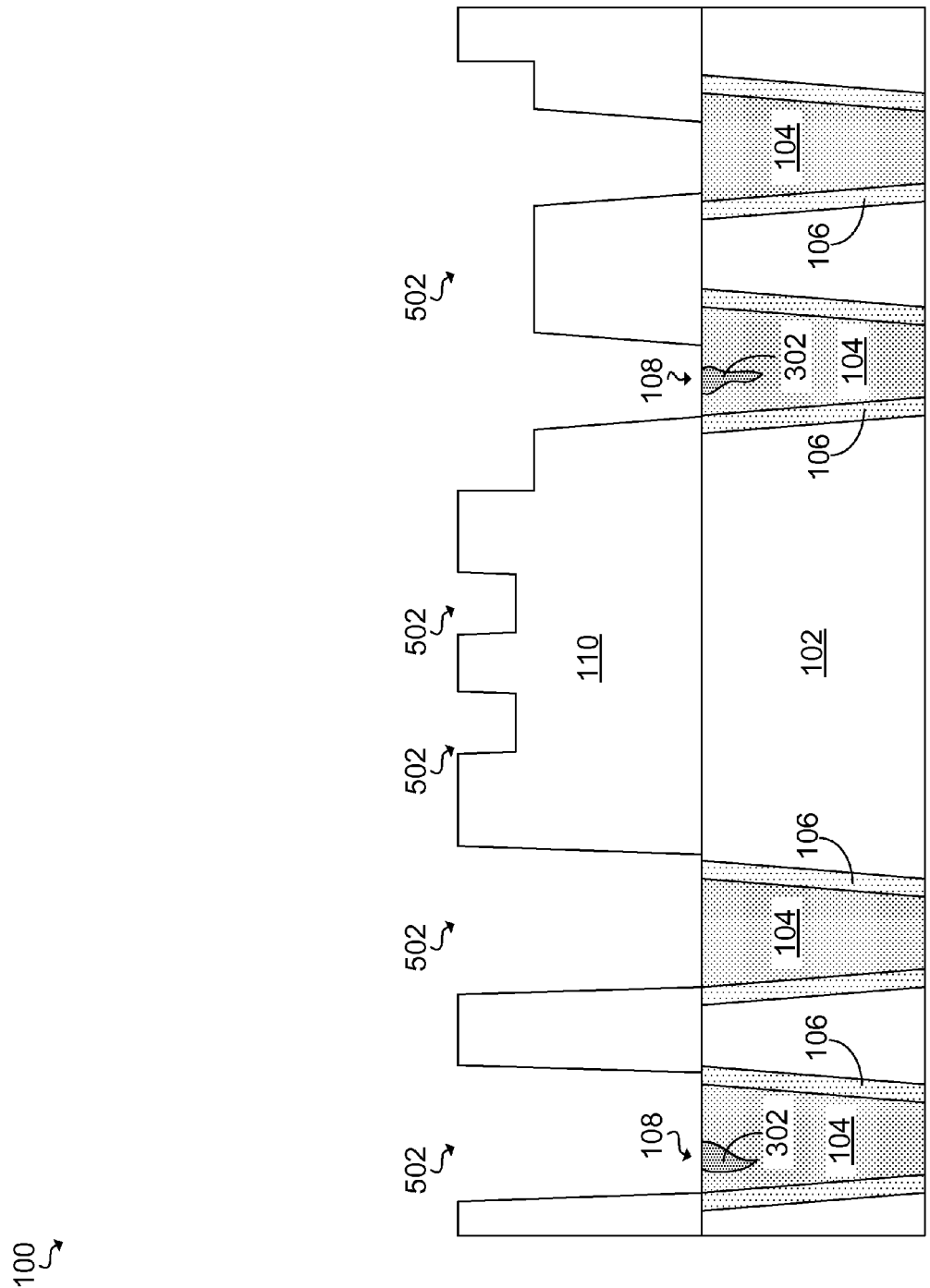
FIG. 5 is a cross section view illustrating removing the sacrificial filler material to form interconnect trenches, according to an embodiment of the present invention.

Referring now to FIG. 5, a cross section view illustrating removing the sacrificial filler material 302 selective to the dielectric layer 110, the caps 104, and the contact liners 106 to form interconnect trenches (i.e., interconnect openings) 502 is shown. In an embodiment in which the sacrificial filler material 302 is composed of an organic material (e.g., an organic resist, an ODL, or organic filler), carbon nanotubes, graphite powder, or buckminsterfullerene, a conventional dry ashing technique, such as, for example plasma ashing, may be used to remove the sacrificial filler material 302. In an embodiment in which the sacrificial filler material 302 is composed of a resist material or nano-particles coated with a surfactant, the sacrificial filler material 302 may be removed with a solvent washing technique, using a solvent specifically chosen to react with the sacrificial filler material 302. In an embodiment, the removal technique may not remove all of the sacrificial filler material, and a portion of the sacrificial filler material 302 may remain in the keyhole defects 108.

Figure 6:
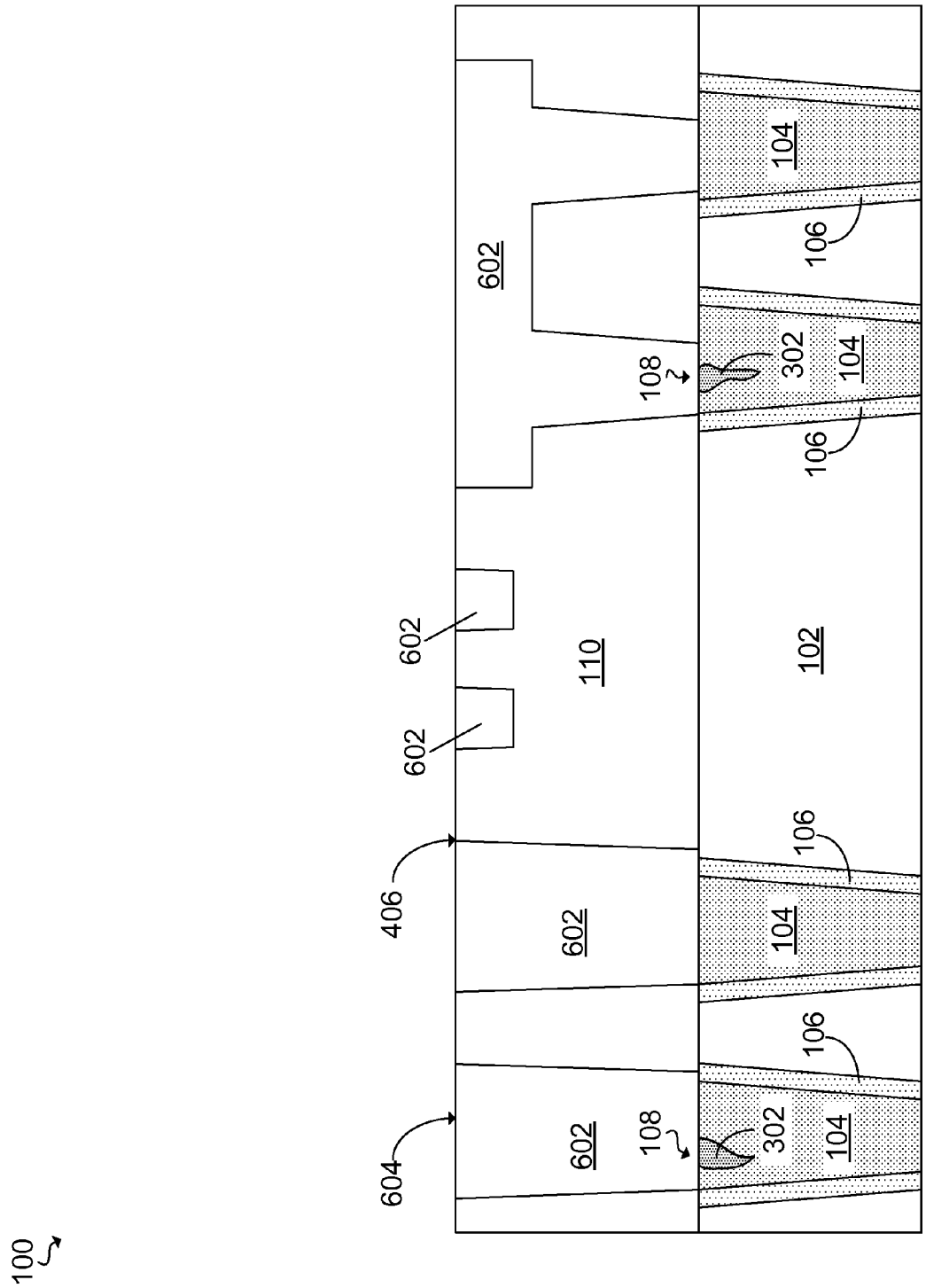
FIG. 6 is a cross section view illustrating forming interconnects by filling the interconnect trenches with a conductive material, according to an embodiment of the present invention.

Referring now to FIG. 6, a cross section view illustrating forming interconnects 602 by filling the interconnect trenches 502 (FIG. 5) with a conductive material. The interconnects 602 may be formed by depositing the conductive material in the interconnect trenches 502 (FIG. 5) using any conventional deposition technique, such as, for example ALD, CVD, PVD, MBD, PLD, or LSMCD. In an embodiment, the conductive material may be composed of a conductive metal, such as, for example, copper, aluminum, tungsten, or alloys thereof. After the conductive material is deposited, a planarization process, such as, for example, CMP, may be performed so that an upper surface 604 of the interconnects 602 may be substantially flush with the upper surface 406 of the dielectric layer 110.

Embodiments of the present invention may protect to the contact liners 106 from damage during the removal the hard mask 120 used to pattern and forming openings 202 in the M1 layer. The sacrificial filler material may be deposited in the openings 202 before the hard mask 120 is removed and may completely cover the contact liners 106, insulating them damage (i.e., "hollow" metal defects) that may occur during the hard mask 120 removal process. This may be particularly beneficial in applications in which the hard mask 120 and the contact liners 106 are composed of a like metal (e.g., a titanium nitride hard mask and a titanium/titanium nitride contact liner). Because the sacrificial filler material 302 may completely cover the contact liners 106, the hard mask 120 may be removed without also involuntarily removing portions of the contact liners 106. The sacrificial material 302 may also fill in keyhole defects 108 present in the upper surface 206 of the contacts 104, thereby improving conductivity and device reliability. In addition, the sacrificial filler material 302 may provide structural integration to the device during planarization of the hard mask 120. This may minimize bending bowing of the device during planarization, which may increase interconnect trench fidelity. The resulting interconnects may have a smaller aspect ratio and more linear sidewalls than openings formed using conventional techniques.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a dielectric layer on a contact, the contact having a vertical sidewall and a contact liner formed thereon;
   forming a hard mask layer on the dielectric layer;
   forming an opening in the hard mask layer and the dielectric layer, such that the contact and the contact liner are exposed;
   filling the opening with a sacrificial filler material, such that the contact and the contact liner are substantially covered by the sacrificial filler material;
   removing the hard mask layer and a portion of the sacrificial filler material, such that an upper surface of the sacrificial filler material in the opening is substantially flush with an upper surface of the dielectric layer; and
   removing the sacrificial filler material from the opening selective to the dielectric layer, the contact liner, and the contact to form an interconnect trench.

2. The method of claim 1, further comprising:
   filling the interconnect trench with a conductive material to form an interconnect in the opening, wherein the interconnect is in electrical contact with the contact.

3. The method of claim 1, further comprising:
   filling a keyhole defect in an upper surface of the contact with the sacrificial filler material.

4. The method of claim 1, wherein the hard mask layer and the contact liner are comprised of common metals.

5. The method of claim 1, wherein the sacrificial filler material is comprised of an organic material.

6. The method of claim 1, wherein the sacrificial filler material is comprised of carbon nanotubes.

7. The method of claim 1, wherein the sacrificial filler material is comprised of nanoparticles.

8. The method of claim 1, wherein the removing the hard mask layer and the portion of the sacrificial filler material comprises:
   planarizing the hard mask layer, the dielectric layer, and the sacrificial filler material.

9. The method of claim 1, wherein the removing the sacrificial filler material from the opening to form the interconnect trench comprises:
   removing the sacrificial filler material using an ashing process.

10. The method of claim 1, wherein the removing the sacrificial filler material from the opening to form the interconnect trench comprises:
    removing the sacrificial filler material using a solvent washing process.

11. A method of protecting a contact liner from damage during a formation of an interconnect structure comprising:
    patterning a dielectric layer using a hard mask;
    forming an opening in the dielectric layer to expose the contact liner, wherein the contact liner is formed on a sidewall of a contact;
    covering the contact liner with a sacrificial filler material; and
    removing the hard mask layer using a planarization process.

12. The method of claim 11, further comprising:
    removing the sacrificial filler material selective to the dielectric layer, the contact liner, and the contact; and
    forming an interconnect in the opening, wherein the interconnect is in electrical contact with the contact.

13. The method of claim 11, further comprising:
    removing a portion of the sacrificial filler material during the planarization process, such that an upper surface of the sacrificial filler material is substantially flush with a surface of the dielectric layer.

14. The method of claim 11, further comprising:
    filling a keyhole defect in an upper surface of the contact with the sacrificial filler material.

15. The method of claim 11, wherein the hard mask layer and the contact liner are comprised of common metals.

16. The method of claim 11, wherein the sacrificial filler material is comprised of an organic material.

17. The method of claim 11, wherein the sacrificial filler material is comprised of carbon nanotubes.

18. The method of claim 11, wherein the sacrificial filler material is comprised of nanoparticles.

19. An interconnect structure comprising:
- a contact in a first layer, the contact having an upper surface that is substantially flush with an upper surface of the first layer;
- a contact liner on a sidewall of the contact, the contact liner having an upper surface that is substantially flush with the upper surface of the contact;
- a keyhole defect in the upper surface of the contact;
- a filler material in the keyhole defect;
- a second layer on the first layer; and
- an interconnect in the second layer, the interconnect extending from an upper surface of the second layer to the upper surface of the contact, such that the interconnect is in electrical contact with the contact.

20. The structure of claim 19, wherein the filler material is comprised of an organic material, carbon nanotubes, or nanoparticles.

* * * * *